United States Patent [19]

Gregory

[11] Patent Number: 4,679,728
[45] Date of Patent: Jul. 14, 1987

[54] ELECTRICAL CONTROL UNIT

[75] Inventor: Mark Gregory, Coventry, England

[73] Assignee: Potterton International Limited, London, England

[21] Appl. No.: 525,990

[22] Filed: Aug. 24, 1983

[30] Foreign Application Priority Data

Aug. 31, 1982 [GB] United Kingdom ............... 8224857

[51] Int. Cl.$^4$ .................. H01H 9/26; H05K 1/14
[52] U.S. Cl. .................. 237/1 R; 200/5 EA; 361/391; 361/395; 361/399
[58] Field of Search .............. 200/5 EA, 11 R, 158; 237/8 R; 339/81, 17 LM; 361/391, 412, 399, 395, 393, 394, 397, 400, 404, 413

[56] References Cited

U.S. PATENT DOCUMENTS

| | | | |
|---|---|---|---|
| 3,796,844 | 3/1974 | Osika | 200/5 EA |
| 4,172,970 | 10/1979 | Grostean et al. | 200/11 R |
| 4,268,100 | 5/1981 | Kekas et al. | 339/17 LM |
| 4,325,103 | 4/1982 | Ito et al. | 361/399 X |
| 4,336,569 | 6/1982 | Tsuda et al. | 361/399 X |
| 4,558,396 | 12/1985 | Kawabata et al. | 361/399 |

Primary Examiner—Henry A. Bennet
Attorney, Agent, or Firm—Cushman, Darby & Cushman

[57] ABSTRACT

An electrical control unit has specific application to central heating systems in which a plurality of electrical connections are to be made to the unit. The unit includes a backplate to which electrical connections may be made at a plurality of positions. A housing, containing control circuits and contacts for making connection between the circuit and the backplate connections, is removably attached to the backplate. Access to the electrical connections on the backplate for testing purposes may be achieved with the housing attached and electrically connected to the backplate, but a cover on the backplate may be positioned to prevent such access during normal operation of the unit. The unit also includes two control switches of which one is operable independently of the other or of which both are independently operable upon release of an interlock. The control circuits include a printed circuit board on which one side is printed. An L-shaped conductor effects electrical connection between the printed side of the circuit board and a display located at the unprinted side of the circuit board.

14 Claims, 5 Drawing Figures

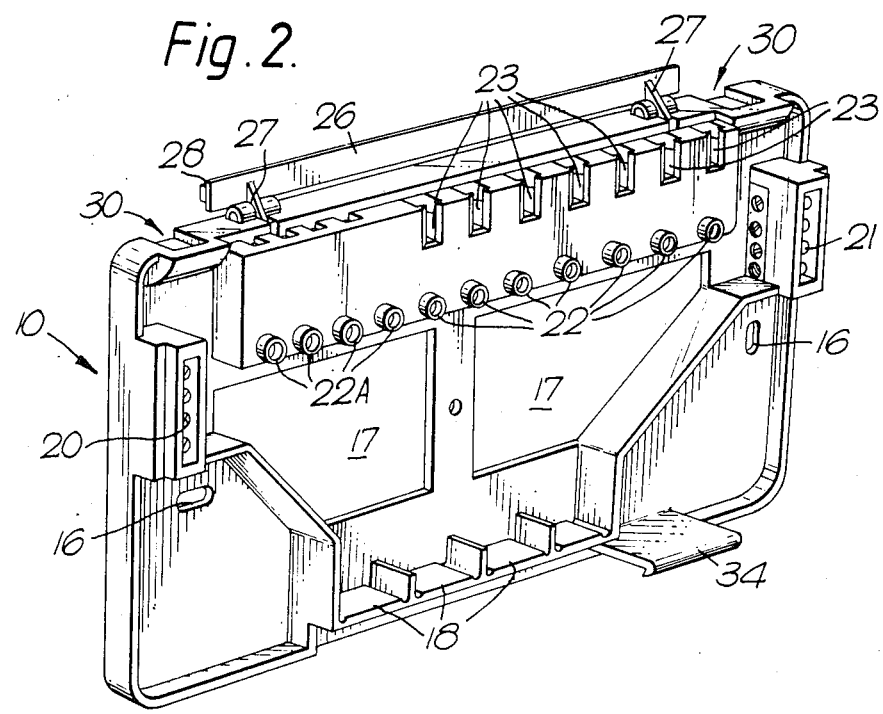
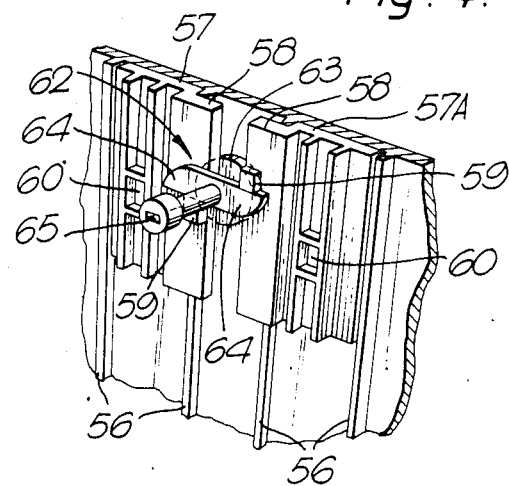

ELECTRICAL CONTROL UNIT

This invention relates to electrical control units and, in particular, to an electrical control unit arranged to be mounted on a surface to receive a plurality of electrical connections leading from various items to be electrically monitored and/or controlled by the unit.

The invention has particular application to control units for central heating systems which may include a wide variation in the number of electrical connections to be made to the electrical control unit. Wall-mounted wiring centres have been proposed for enabling the electrical connections to be more readily made but such wiring centres are separate from the control unit to which they may be connected.

After installation of a central heating system and associated control unit it is necessary to test the electrical circuits, including the control unit, to ensure that the system will operate satisfactorily. This is not readily achieved with existing systems and it is an object of the invention to provide a control unit which enables installation and testing of the associated system to be more readily achieved.

According to one aspect of the invention an electrical control unit comprises a backplate for mounting on a surface such as a wall, and a housing for electrically operated control circuits, the backplate having means for terminating external electrical connections at a plurality of positions, the housing being removably secured on the backplate and having means for electrically connecting the control circuits with at least some of the terminations on the backplate upon mounting the housing on the backplate, and the terminations on the backplate having a cover member selectively movable between positions in which, in a first position with the housing mounted on the backplate, the terminations are accessible externally of the unit and in a second, operative position the terminations are inaccessible externally of the assembled backplate and housing.

Preferably the cover member is movable from said second position to said first position only when the housing is demounted from the backplate and once the housing is secured to the backplate the cover member cannot be moved between said two positions.

Conveniently the cover member is hingedly mounted on the backplate and, in said second position, is locked in this position by engagement with the housing.

In a preferred arrangement the housing includes a plurality of pins which are arranged to effect electrical connections between the control circuits and at least some of the electrical terminations on the backplate, the terminations each defining opposed electrical conductors forming a slot in which the respective pins are arranged to engage.

The mounting of the housing on the backplate may be such that the housing is pivotable from a fully mounted and secured position towards a position in which the housing is detachable from the backplate. During such pivoting action the pins on the housing are engaged and disengaged from said conductors on the backplate. For achieving the pivoting and detachment action an arcuate track is provided on the backplate or on the housing and a curved member on the other member is engageable to move along and be retained in the track during the pivoting action, the curved member being releasable from the track on reaching one end thereof.

Such track and cooperating curved member are conveniently located at one side of the unit and a latch is provided at the opposite side of the unit to retain the housing on the backplate when assembled for use.

According to a further aspect of the invention an electrical control unit includes two switches each movable between successive switching positions along a path lying parallel to and adjacent the other, each switch having a stop member, and an interlock between the switches being provided in the form of a cam member engageable with the stop members whereby one of the switches is movable between the switching positions independently of the other switch and the other of the switches is fixed against movement relative to said one switch from one of the switching positions unless said one switch is moved from a position corresponding to said one switching position.

In the case of the control unit for a central heating system which includes control of a water heating system said one of the switches is arranged to operate the water heating system which can thus be operated independently of the central heating system, but the other of the switches, which operates the central heating system is only movable to actuate the central heating when the water heating system has been operated.

For the case when the water heating system and the central heating system are operable independently of one another the cam member is rotatable to a position in which the stop members are disengaged so that both switches are movable independently between the associated switching positions.

According to a still further aspect of the invention a control unit includes a printed circuit board one side only of which carries a printed circuit to which various control circuit elements are electrically connected, a digital display unit positioned adjacent the side of the circuit board opposite the printed circuit, and a connecting element for connecting a plurality of electrical connections on the display unit with a plurality of electrical connections on the printed circuit, wherein the connecting element is a generally L-shaped elastomeric connector having surface electrical conductors for connecting connections on the display unit with corresponding connections on the circuit board, the L-shaped connection extending through an aperture in the circuit board adjacent the connections.

The L-shaped connector is conveniently in the nature of a strip which is L-shaped in cross-section a portion of the longitudinal surface of the strip carrying the conductors.

Further features of the invention will appear from the following description of an embodiment of the invention given by way of example only and with reference to the drawings, in which:

BRIEF DESCRIPTION OF DRAWING

FIG. 2 is a perspective view of a backplate for the unit of FIG. 1,

FIG. 4 is a scrap view of a switch interlock of the unit, and

Figure 1:
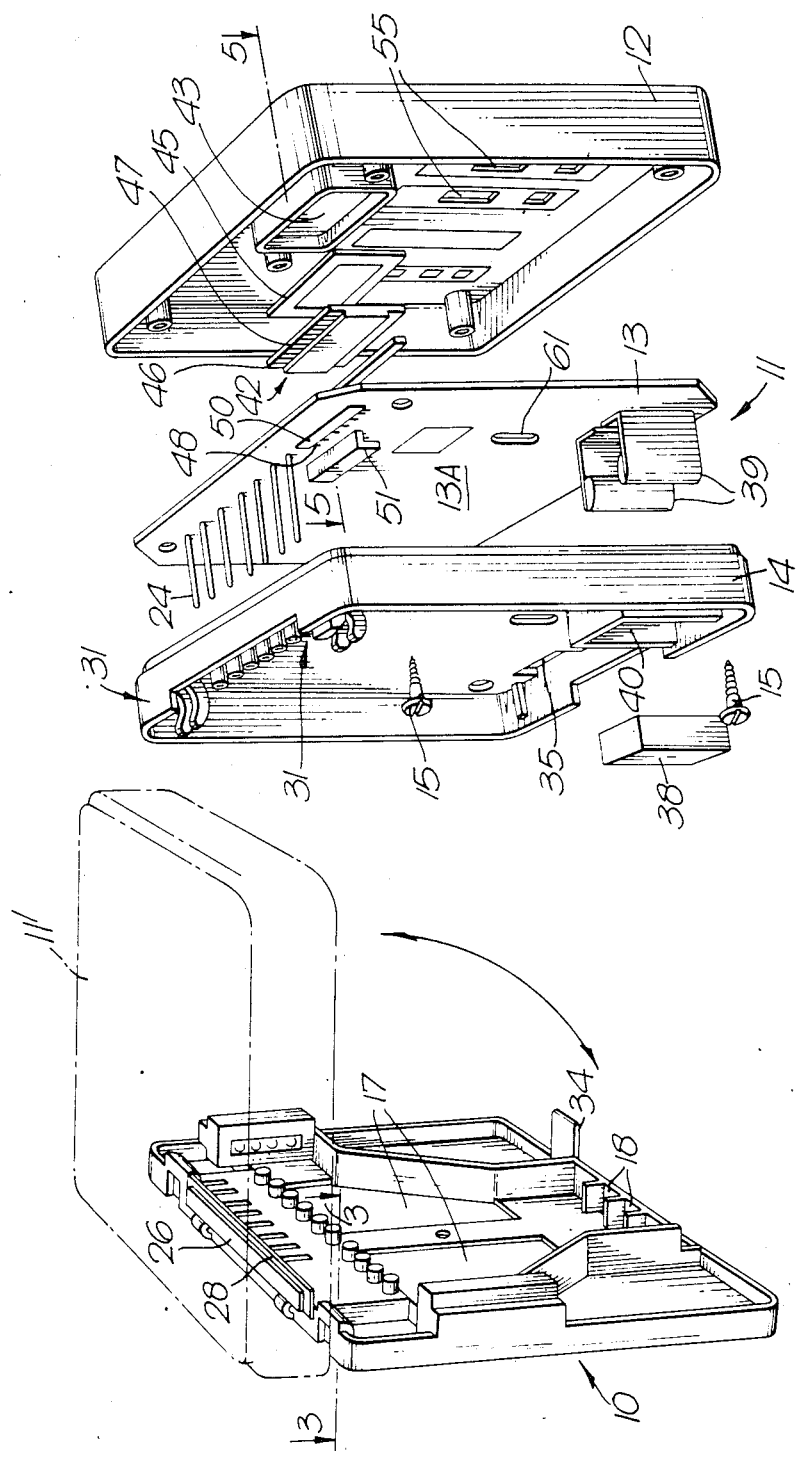
FIG. 1 is an exploded perspective view of an electrical control unit.

Referring to the drawings a control unit for a central heating system is shown, the control unit being primarily intended to be mounted on a wall surface.

The unit comprises two main parts a backplate 10 and a housing 11, the housing consisting of a front cover 12, a printed circuit board 13 and a back cover 14 which are, once assembled, normally permanently secured together by screws 15. The backplate 10 is secured on the wall surface by screws passing through openings 16 in the backplate 10 and the assembled housing 11 is detachably mounted on the backplate, as will be described.

The backplate 10 constitutes a wiring centre to which various wires from the central heating system are connected. For this purpose the wires may enter the backplate through two openings 17 from the wall, for hidden wiring, or portions 18 of the backplate may be broken away for the wires to enter from beneath the backplate, for surface wiring.

The backplate is formed of a plastics moulding and has three sets of wiring terminations, a busbar set 20 for neutral connections, a busbar set 21 for earthed connections, and a set 22 for connections to be made to the circuit board 13, the set 22 including plain terminals 22A for wires not requiring to be connected to the circuit board 13. Thus the backplate is capable of accepting up to fifty-seven wire terminations.

Each wiring termination is of the simple pillar type and is capable of taking up to three wires each. The set 22 of terminations to be connected to the circuit board include forked contacts each consisting of resilient, spaced, parallel conductors 23 formed of presssings which are rivetted to the associated wiring terminal, the conductors being engageable by pins 24 to effect electrical connection between the backplate and the circuit board 13, as will be described.

To enable access to the set 22 of terminations to be gained with the backplate 10 mounted on the wall and with the housing mounted on the backplate, the backplate 10 is formed with a cover plate 26 pivoted about pivots 27 to be movable between a closed position, as shown in FIG. 1, to an open position, as shown in FIG. 2. As will be seen, in the open position access can be gained to the terminations 22 for testing the electrical wiring of the system with the housing in position on the backplate and the control unit in an operative condition for effecting control of the system.

However the cover plate 26 can be located in the closed position when the housing 11 is mounted on the backplate 10 and locked in this position to prevent access to the terminations 22 by the user. The cover 26 can only be moved from the closed position to the open position by removal of the housing from the backplate due to locking engagement of the housing part 14 over flanged edges 28 of the cover plate 26. Movement of the plate 26 from the closed position towards the open position is resisted by the hinge.

Figure 3:
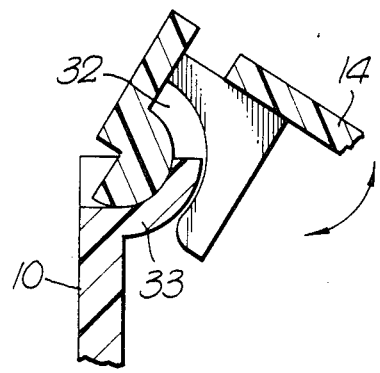
FIG. 3 is a cross-section on the line 3—3 in FIG. 1.

To secure the housing to the backplate the backplate has along its upper edge, adjacent the ends of the cover plate 26, hinge elements 30 which cooperate with hinge elements 31 on the part 14 of the housing 11, as best seen in FIG. 3. The elements 31 each define an arcuate track 32 in which an arcuate member 33 of the elements 30 is engageable, engagement of the member 33 in the track 32 being possible when the housing 11 is in the horizontal position 11' in FIG. 1, i.e. when the housing is inclined at about 90° to the backplate 10. Once the housing hinge elements 31 are engaged with the backplate hinge elements 30 and the housing is moved downwards about the elements the housing is hingedly mounted on the backplate and is secured thereto. Upon approaching a vertical position a catch 34 on the back-plate at the opposite edge to the hinge elements 30 engages in a slot 35 in the part 14 and latches against an edge of the slot to secure the housing and backplate together. The housing can only be removed from the backplate by inserting a tool under and against the catch 34 to disengage it from the slot 35 and thereafter hinging the housing upwards until it again reaches position 11' at which the housing can be detached from the backplate.

During such up and down pivoting movement of the housing relative to the backplate electrical connections are made between a plurality of elongate pins 24 which extend rearwardly from the housing and the conductors 23 of the terminations 22. The pins 24 each pass between and move apart a pair of conductors 23 to make electrical contact therewith as the housing is fitted to the backplate, and the arrangement is such that when the housing has reached position 11' the pins 24 have become disconnected from the conductors 23.

The pins 24 effect electrical connection between the terminations 22 and the circuit board 13 carrying the control circuitry for the system and the circuitry is programmable according to the user's requirements.

The details of the control circuitry do not form part of the present invention but some aspects are of relevance. The circuit board 13 is printed on one side 13A only and on its other side (not shown) the circuit board carries various electronic components connected through the circuit board with the printed circuits in known manner. Said other side also carries various switches (not shown) for programming the heating system. In addition, for providing the control unit with a memory in the event that electrical supply to the unit is cut off, the unit includes a rechargeable battery 38. The battery engages with terminals 39 secured to the circuit board 13 and extending rearwardly therefrom. The terminals 39 are arranged to pass through corresponding slots (not shown) in the part 14 to enter a battery compartment 40 in the rear side of the part 14. Thus when the housing 11 is assembled the battery 38 is located between the terminals 39 and retained in the compartment 40 and, in order to replace the battery, should this become necessary, the housing is simply detached from the backplate 10. In this way it is unnecessary to take the housing apart to replace the battery 38.

Figure 5:
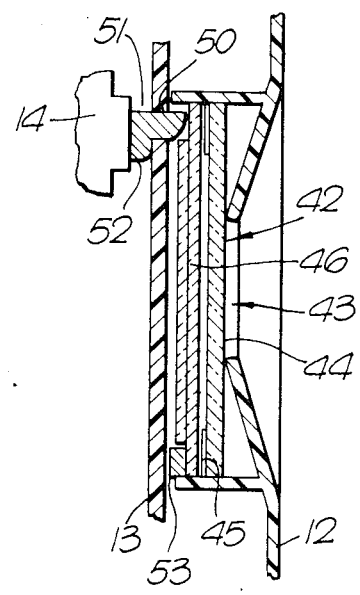
FIG. 5 is a cross-section on the line 5—5 in FIG. 1.

The control unit also includes a digital display assembly 42 which displays information to the user through a rectangular aperture 43 in the front cover 12. The aperture 43 locates a glass cover 44, a gasket element 45 and a display unit 46 on which the visual information is displayed, a liquid crystal display being used in this case. The display unit 46 includes a plurality of electrical contacts 47 along its upper edge which are to be electrically connected to a corresponding series of contacts 48 on the printed circuit side 13A of the circuit board 13. The contacts 48 are located adjacent an elongate slot 50 formed in the circuit board and in order to effect connection between the contacts 47 and 48 an elastomeric electrical connector 51, which is generally L-shaped in cross-section, is located through the slot 50 and in contact with the contacts 47 and 48, as best seen in FIG. 5. The connector is formed as a strip with a plurality of discrete electrical conductors 52 over one side surface thereof and extending transversely of the strip.

An elastomeric spacer 53 is located between the display unit 46 and the circuit board at the opposite edge to the connector 51 to locate the display unit 42 when the housing is assembled. It will be seen that the use of the L-shaped connector 51 enables a single-sided printed circuit board to be used while electrically connecting the display unit 42 with the printed circuitry from a position remote from the printed circuit side 13A of the circuit board.

In practice the visual display unit 42 displays the time i.e. the time set for operation of the heating system and other relevant information concerning the programmed setting of the control unit. The settings are achieved by various control switches on the circuit board which extend through apertures formed in the front cover 12 of the housing. Among these control switches are two switches controlling the operation of the hot water heating system and the operation of the central heating system. In some heating systems the central heating can not be operated unless the hot water heating system is also operating, while in other systems the two can be operated independently. So that the control unit can be operated under either arrangement these two switches are provided with an interlock by which one or other arrangement may be selected by the installer of the system. The interlock is described with reference to FIGS. 1 and 4.

The front cover 12 of the housing is of moulded plastics and is formed with two parallel, spaced slots 55 alongside each of which are formed a pair of guides 56. A switch body 57 and 57A is located between each pair of guides 56 and each body has a forwardly extending switch member (not shown) for the operator to engage, the switch member projecting through the slot 55. To the rear each body 57 and 57A is formed with a laterally projecting flange 58 on which is formed a stop member 59 displaced from a mid position between the upper and lower ends of the body 57 and 57A, the stop member 59 of one body being displaced to one side and the stop member 59 of the other body being displaced to the other side of said mid position.

The rear of each body 57 and 57A is also formed with a socket 60, in which is engaged a switch (not shown) carried on the circuit board whereby when the body is moved along the guides 56 the switch is moved between a plurality of switching positions to select a heating operation programme. A cam member 62 is located between the bodies 57 and 57A and through a slot 61 in the circuit board so that in one position, as shown in FIG. 4, the member 62 controls relative movement between the bodies 57. The cam member 62 has at one end a disc-like head 63 having oppositely-directed radial protrusions which engage the inner faces of the inner pair of guides 56. The protrusions are arranged to enable resisted rotation of the member 62 in one direction through about 90° about its axis.

The cam member 62 is also formed with laterally projecting portions 64 arranged to engage with the stop members 59 in the position shown, one portion 64 above the stop member of one of the bodies 57 and one portion 64 below the stop member of the other of the bodies 57A.

At the other end of the cam member 62 to the head 63 is a slotted head 65 having a slot for engagement by a tool, such as a screwdriver, to rotate the member 62 about 90° about its axis from the position shown in FIG. 4 to a position in which the portions 64 are not in contact with the stop members 59. Such rotational movement is made against the resistance offered by radiused parts of the head extending between the protrusions which parts engage with the inner faces of the inner pair of guides 56, whereby the member 62 remains in either one of the selected positions. To effect this rotational movement the body 57 is moved to its lowermost position and the body 57A remains in its uppermost position. Return of the member 62 to the initial position is by resisted rotation through about 90° in the opposite direction.

It will be seen that one of the switch bodies 57 can be moved along its guide quite independently of the other body 57A because its stop member 59 lies below the respective cam member portion 64. This body 57 is that which controls the hot water heating system. The other of the switch bodies 57A for the central heating switch is, however, movable from the "off" position shown when the switch body 57 has been moved downwards from the initial ("off") position, or by movement of the body 57A causing movement of the body 57 away from the "off" position.

What I claim as my invention and desire to secure by Letters Patent of the United States is:

1. An electrical control unit comprising a backplate for mounting on a surface such as a wall, and a housing for electrically operated control circuits, the backplate having means for terminating external electrical connections at a plurality of positions, the housing being removably secured on the backplate and having means for electrically connecting the control circuits with at least some of the terminations on the backplate upon mounting the housing on the backplate, and the terminations on the backplate having a cover and means for selectively moving said cover member when said housing is removed from said backplate between positions in which, in a first position, even with the housing mounted on the backplate, the terminations are accessible externally of the unit, and in a second, operative position the terminations are covered by said cover plate and inaccessible externally of the assembled backplate housing.

2. An electrical control unit according to claim 1 wherein the cover member is movable from said second position to said first position only when the housing is demounted from the backplate and once the housing is secured to the backplate the cover member cannot be moved between said two positions.

3. An electrical control unit according to claim 1 wherein the cover member is hingedly mounted on the backplate and, in said second position, is locked in this position by engagement with the housing.

4. An electrical control unit according to claim 1 wherein the housing includes a plurality of pins which are arranged to effect electrical connections between the control circuits and at least some of the electrical terminations on the backplate, the terminations each defining opposed electrical conductors forming a slot in which the respective pins are arranged to engage.

5. An electrical control unit according to claim 4 wherein the mounting of the housing on the backplate is such that the housing is pivotable from a fully mounted and secured position towards a position in which the housing is detachable from the backplate and during such pivoting action the pins on the housing are engaged and disengaged from said conductors on the backing plate.

6. An electrical control unit according to claim 5 wherein an arcuate track is provided on the backplate or on the housing and a curved member on the other member is engageable to move along and be retained in the track during the pivoting action, the curved member being releasable from the track on reaching one end thereof.

7. An electrical control unit according to claim 6 wherein the track and cooperating curved member are located at one side of the unit and a latch is provided at the opposite side of the unit to retain the housing on the backplate when assembled for use.

8. An electrical control unit according to claim 1 wherein the housing includes means for releasably mounting and electrically connecting a power supply element, the mounting means extending from the housing towards the side thereof adjacent the backplate whereby when the housing is released from the backplate the power supply element is replaceable.

9. An electrical control unit including two switches each movable between successive switching positions along a path lying parallel to and adjacent to each other, each switch having a stop member, and an interlock between the switches being provided in the form of a cam member engageable with the stop members whereby one of the switches is movable between the switching positions independently of the other switch and the other of the switches is fixed against movement relative to said one switch from one of the switching positions unless said one switch is moved from a position corresponding to said one switching position.

10. An electrical control unit according to claim 9 wherein said one of the switches is arranged to operate a water heating system which can thus be operated independently of a central heating system, and the other of the switches, which operates the central heating system is only movable to actuate the central heating when the water heating system is operated.

11. An electrical control unit according to claim 9 wherein the cam member is rotatable to a position in which the stop members are disengaged so that both switches are movable independently between the associated switching positions.

12. An electrical control unit according to claim 9 wherein the switches, the associated stop members and interlock are mounted on a housing mounted movably and releasably on a backplate to which a plurality of electrical connections can be made.

13. An electrical control unit according to claim 1 further comprising a printed circuit board one side only of which carries a printed circuit to which various control circuit elements are electrically connected, a digital display unit positioned adjacent the side of the circuit board opposite the printed circuit, and a connecting element for connecting a plurality of electrical connections on the display unit with a plurality of electrical connections on the printed circuit, wherein the connecting element is a generally L-shaped elastomeric connector having surface electrical conductors for connecting connections on the display unit with corresponding connections on the circuit board, the L-shaped connection extending through an aperture in the circuit board adjacent the connections.

14. An electrical control unit according to claim 13 wherein the L-shaped connector is in the nature of a strip which is L-shaped in cross-section a portion of the longitudinal surface of the strip carrying the conductors.

* * * * *